United States Patent [19]
Konig et al.

[11] Patent Number: 4,611,194
[45] Date of Patent: Sep. 9, 1986

[54] ANALOG-TO-DIGITAL CONVERTER

[75] Inventors: Charles E. Konig, Staten Island, N.Y.; William J. Skudera, Jr., Eatontown, N.J.

[73] Assignee: The United States of America as represented by the Secretary of the Army, Washington, D.C.

[21] Appl. No.: 766,371

[22] Filed: Aug. 16, 1985

[51] Int. Cl.$^4$ ............................................. H03M 1/12
[52] U.S. Cl. ..................... 340/347 SH; 340/347 AD; 324/103 P
[58] Field of Search ................. 340/347 SH, 347 AD; 324/103 R, 103 P

[56] References Cited

FOREIGN PATENT DOCUMENTS 2082410 3/1982 United Kingdom ........ 340/347 AD

OTHER PUBLICATIONS

ELINT "Microwave & RF", Konig, Sep. 1984, pp. 150–151, 155 and 225.

*Primary Examiner*—Charles D. Miller
*Attorney, Agent, or Firm*—Anthony T. Lane; Jeremiah G. Murray; Paul A. Fattibene

[57] ABSTRACT

An apparatus is disclosed which permits a high speed waveform, for example in the form of a series of analog data pulses, to be sampled and converted into a series of digital values. Each analog data pulse is applied in parallel to a multiplicity of A/D converters and to one or more level detectors. Each level detector provides a strobe when the voltage of the analog data pulse crosses a reference threshold. The strobes are applied to delay means whose outputs are a multiplicity of delayed strobe pulses which have been delayed by predetermined amounts. Each of the multiplicity of delayed strobes is applied, along with the analog data pulse, to one of the multiplicity of A/D converters. Each of the multiplicity of A/D converters samples the analog data pulse in response to the particular delayed strobe applied thereto and provides a digital value of that sample. The largest of the digital values from each of the A/D converters is provided as the output of the apparatus for each analog data pulse.

7 Claims, 4 Drawing Figures

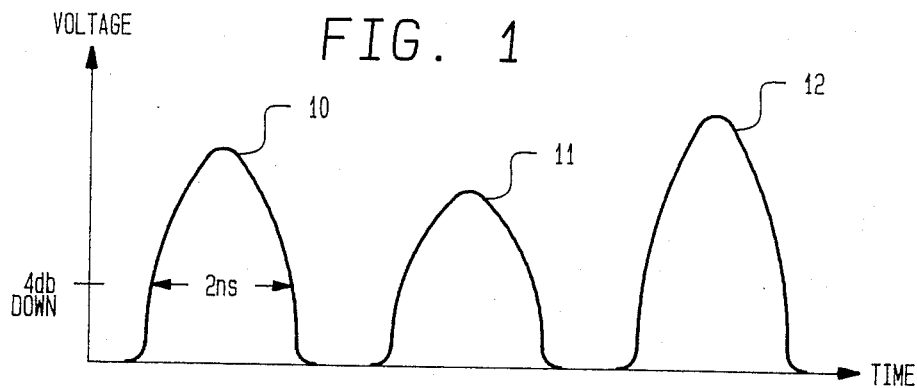
FIG. 1
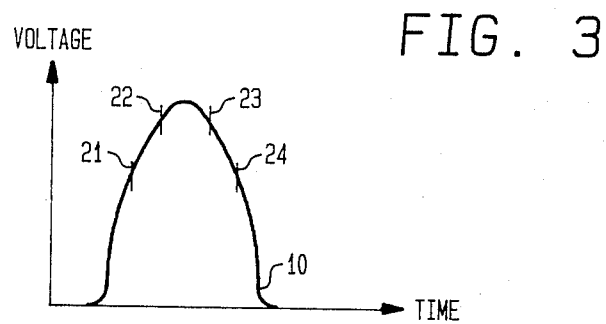
FIG. 3
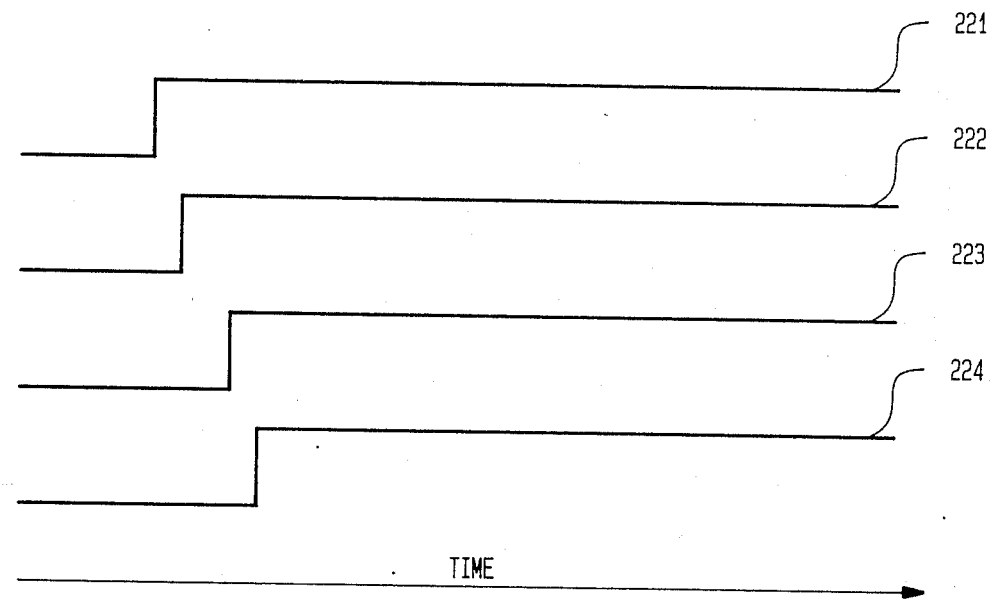

ANALOG-TO-DIGITAL CONVERTER

The invention described herein may be manufactured, used, and licensed by or for the Government for Governmental purposes without the payment to us of any royalties thereon.

BACKGROUND OF THE INVENTION

1. Field of the Invention

The present invention pertains to a high speed analog-to-digital converter.

2. Description of the Prior Art

Electronic intelligence (ELINT) systems utilize compressive receivers to detect and separate input signals from threat radars. In a particular ELINT system described in an article entitled "ELINT Design Melds Classic Methods" by Charles Konig in *Microwave & RF* September 1984, pp. 150, 151, 155 and 225, a voltage-controlled oscillator sweeps the band of interest and converts it to a 500 MHz wide intermediate frequency (IF). In a compressive receiver section of the ELINT system, a sweeping local oscillator (SLO) generates a linear FM chirp signal that mixes with the incoming signal. The resulting output signal passes through a surface acoustic wave (SAW) compression filter that has a negative frequency-versus-delay slope which matches the chirp of the resulting output signal. Consequently, the sweep produces a time-compressed pulse at the output of the SAW filter for each signal in its passband. During the SLO sweep, each frequency component present in the RF input signal moves across the IF bandwidth and appears at the input to the dispersive SAW filter as a linear FM signal. When the sweep rate of the SLO is equal to the delay slope of the dispersive filter, a time-compressed pulse occurs at the filter output for every frequency component of the input. The position of a compressed pulse in time, referenced to the beginning of the SLO sweep, corresponds to the carrier frequency of an incoming pulse. Thus a spectrum analysis or impulse response of the input signal is produced at the output of the SAW filter. An analysis bandwidth of 500 MHz creates compressed pulses as narrow as 2 ns in the frequency channels. A parameter measurement unit (PMU) tags each signal's time of arrival (TOA), measures its amplitude and pulse width, and determines its frequency and electrical phase angle for calculation of the angle of arrival (AOA).

Thus, the output of a compressive receiver, in the above application, is a series of analog data pulses having a 2 nanosecond (ns) pulsewidth at 4 db, which pulses occur on the order of 10 ns apart. The amplitude of the analog data pulses corresponds to such data as the phase of the angle of arrival of the incoming signals.

To suitably analyze these compressive receiver output pulses, it is necessary to convert each analog data pulse into its digital equivalent. This requires apparatus which can effectively sample such 2 ns pulses. In order to effectively sample such pulses, a sampling rate of at least 500 MHz is required. Unfortunately, 500 MHz analog-to-digital converters which provide six or eight bit quantization outputs for such pulses are either not currently available or are very expensive.

SUMMARY OF THE INVENTION

I have invented an apparatus which permits a high speed waveform, for example in the form of a series of analog data pulses, to be sampled and converted into a series of digital values through the use of relatively inexpensive, low speed analog-to-digital (A/D) converters. In particular, one embodiment of the present invention utilizes conventional 100 MHz A/D converters along with conventional ECL circuitry to provide an effective 500 MHz A/D converter.

In embodiments of the present invention, each analog data pulse is applied in parallel to each of a multiplicity of A/D converters and to one or more level detectors. Each level detector provides a strobe when the voltage of the analog data pulse crosses a reference threshold. The strobes are applied to delay means whose outputs are a multiplicity of delayed strobe pulses which have been delayed by predetermined amounts. Each of the multiplicity of delayed strobes is applied, along with the analog data pulse, to one of the multiplicity of A/D converters. Each of the multiplicity of A/D converters samples the analog pulse in response to the particular delayed strobe applied thereto and provides a digital value of that sample. In a particular embodiment, the largest of the digital values from each of the A/D converters is taken as the output of the apparatus for each analog data pulse.

BRIEF DESCRIPTION OF THE DRAWING

A complete understanding of the present invention may be gained by considering the following detailed description in conjunction with the accompanying drawing, in which:

FIG. 1 shows, in pictorial form, an analog data stream of pulses produced by a compressive receiver known in the art;

FIG. 3 shows, in pictorial form, delayed strobe pulses and the corresponding points along a typical analog data pulse at which a multiplicity of A/D converters sample in response to the delayed strobe pulses.

To facilitate reader understanding, identical reference numerals are used to designate elements common to the figures.

DESCRIPTION OF THE PREFERRED EMBODIMENT

Embodiments of the present invention sample and convert a high speed waveform into a series of digital values. In particular, I will describe an embodiment which detects and quantizes the peak value of each analog data pulse of a stream of such pulses. Embodiments of the present invention are applicable to real time video signal processing and specifically, as described herein, to real time processing of the outputs of a compressive receiver in a typical ELINT system.

FIG. 1 shows, in pictorial form, analog data pulses 10, 11 and 12. Each pulse is approximately 2 ns wide at the 4 db level and appears approximately every 10 ns. Such pulses are representative of analog data pulses produced by a compressive receiver of a typical ELINT apparatus for detecting and analyzing radar signals inpinging thereon.

In order to effectively sample a 2 ns pulse such as pulses 10–12, a sampling rate of at least 500 MHz is required. However, embodiments of the present invention, and in particular the embodiment shown in FIG. 2, utilize 100 MHz A/D converters, which are known in the art, to provide an effective 500 MHz A/D converter. In addition, the embodiment advantageously provides a digital equivalent of the analog data pulse at or near the peak thereof.

Figure 2:
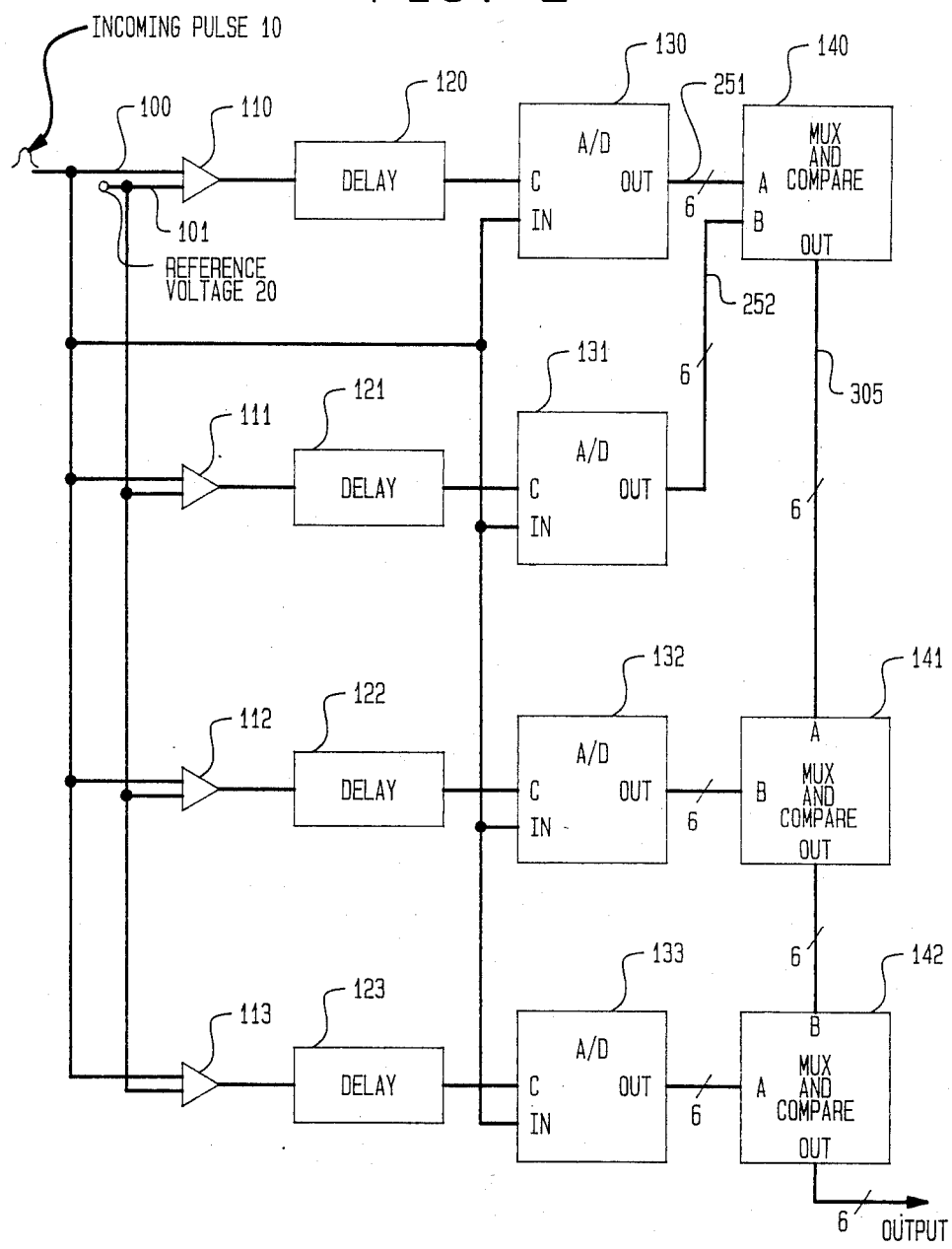
FIG. 2 shows, in block diagram form, an apparatus fabricated in accordance with the present invention.

Referring to FIG. 2, incoming analog data pulses, illustratively pulse 10, are applied over lead 100 to first inputs of level detectors 110-113. In this embodiment, level detectors 110-113 are ECL comparators known in the art and have a reference voltage 20 applied, over lead 101, to second inputs thereof. When the magnitude of the incoming analog data pulse exceeds reference voltage 20, each level detector produces a pulse at its output. Thus, level detectors 110-113 provide strobe pulses to delay means 120-123. Here, owing to the high frequencies involved in converting 2 ns pulses, a level detector is associated with each delay means. At lower frequencies, the output of a single level detector could be applied in parallel to each of delay means 120-123.

Each of delay means 120-123 delays the strobe pulse applied thereto by successively greater amounts. For example, delay means 120 delays the strobe pulse applied thereto by 1 ns, delay means 121 delays the strobe pulse applied thereto by 2 ns, delay means 122 delays the strobe pulse applied thereto by 3 ns, and delay means 123 delays the strobe pulse applied thereto by 4 ns. In the embodiment of the invention shown herein, each delay means may be fabricated from coaxial cable, illustratively RG-58. The delays indicated herein are of critical tolerance and it is difficult to fabricate a 1 ns delay. The cables used must be matched and measured according to techniques well known in the art, which techniques include the use of a network analyzer to measure the phase and amplitude of transmitted waves. The network analyzer utilizes one signal as a reference and measures another signal with reference thereto. Note that in an application that does not require nanosecond type delays, digital delay circuits known in the art can be used instead of the delay means fabricated from coaxial cable discussed above.

The delayed strobe outputs from delay means 120-123 are applied, along with analog data pulse 10, to A/D converters 130-133, respectively. Analog data pulse 10 is applied to the "IN" input of the A/D converters and the delayed stobe outputs are applied to the "C" or convert input of the A/D converters. A/D converters 130-133 are conventional A/D converters known in the art which have a 100 MHz sample time, illustratively a TRW TDC1029 flash , i.e. "short aperture", 6-bit parallel A/D converter. Such A/D converters have a 2 ns aperture jitter, i.e. after a delay of 2 ns, the input comparators of the A/D are latched, thus sampling the analog input at the times indicated by the delayed strobes. Clearly, the A/D converters in this embodiment must be ready to provide another sample by the time the next input analog data pulse arrives in order to provide a digital output for each pulse.

FIG. 3 shows, in pictorial form, analog pulse 10 from FIG. 1 and the points 21-24 at which the pulse is sampled by A/D converters 130-133, respectively. Points 21 and 24 are 1 ns apart in time. Curves 221-224 are the delayed strobes output from delay means 120-123.

The output of each of A/D converters 130-133 is a six (6) bit representation of the amplitude of analog data pulse 10 taken at the time specified by the delayed strobe applied to the "C" or convert input thereof. The outputs from A/D converters 130-133 can be manipulated in a variety of ways to provide an output from the inventive apparatus. For example, in one embodiment, not shown, the average of the outputs is computed in accordance with apparatus known in the art to provide the output from the inventive apparatus. In the embodiment shown in FIG. 2, the inventive apparatus determines the peak value of analog data pulse 10 by comparing the outputs from A/D converters 130-133 and choosing the largest value to represent the peak. In particular, in FIG. 2, the outputs from A/D converters 130 and 131 are applied to "multiplexer and compare" circuit 140. The output from "multiplexer and compare" circuit 140 is the larger of the two inputs. The output of A/D converter 132 and the output of "multiplexer and compare" circuit 140 are applied to "multiplexer and compare" circuit 141 and so forth.

Figure 4:
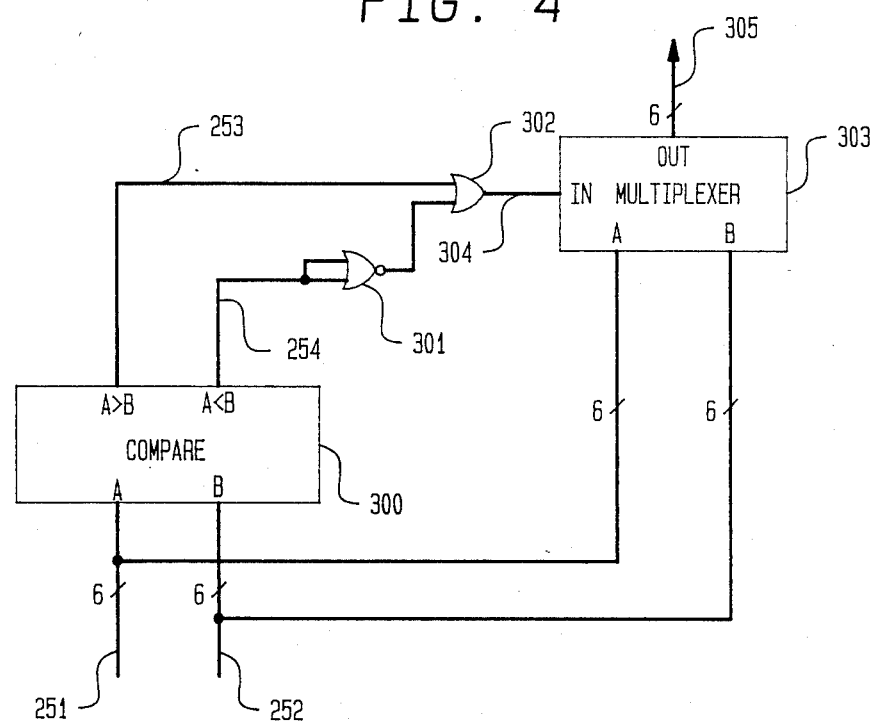
FIG. 4 shows, in pictorial form, the "multiplexer and compare" portion of the inventive apparatus.

FIG. 4 shows, in block form, a circuit which implements each "multiplexer and compare" circuit, illustratively circuit 140 described above. Due to the speeds involved, the circuit shown in FIG. 4 is preferably implemented using ECL logic. In particular, inputs 251 and 252, shown illustratively as being six bit representations of data, are applied to compare circuit 300, illustratively Motorola compare circuit MCKH166. Inputs 251 and 252 are also applied to the A and B inputs of multiplexer circuit 303, illustratively Motorola multiplexer MCKH173. If the data appearing on input 251 (input A) is larger in value than that appearing on input 252 (input B), then comparator 300 causes a "high" to appear at its A>B output. From there, this is routed, via lead 253, to an input of OR gate 302, illustratively Motorola OR gate MCKH101. If the data appearing on input 251 (input A) is lower in value than that appearing on input 252 (input B), then comparator 300 causes a "low" to appear at its A<B output. From there, this is routed, via lead 254, to an input of NAND gate 301, illustratively Motorola NAND gate MCKH104. The output of NAND gate 301 is applied to the input of OR gate 302. Thus, when input 251 is greater than input 252, a "high" is applied to lead 304 and thereby to the input of multiplexer 303. In response thereto, multiplexer 303 applies input 251 as output on leads 305. Alternatively, when input 251 is less than input 252, a "low" is applied to lead 304 and thereby to the input of multiplexer 303. In response thereto, multiplexer 303 applies input 252 as output on leads 305.

A/D converters 130-133 may cause some distortion of the output because they have an input bandwidth which is less than the bandwidth of the input signal. For example, in the embodiment described here, the TRW TDC 1029 A/D converters have a 50 MHz input bandwith and the input signal has a 500 MHz bandwidth. This distortion manifests itself as follows: a tall thin input pulse will appear to be lower in height and wider than it really is. Thus, the frequency response of the A/D converters causes it to see a lower pulse height than is actually present because it cannot react as quickly as the input signal.

It should also be clear to those skilled in the art that further embodiments of the present invention may be made by those skilled in the art without departing from the teachings of the present invention.

What is claimed is:

1. Apparatus for providing an analog-to-digital conversion of an analog signal which comprises:
   means for detecting the analog signal at at time and generating a multiplicity of strobe signals,
   means for delaying each strobe signal by successively greater predetermined amounts from the time,
   a multiplicity of means for sampling the analog signal and providing a digital representation of the sample, each of the samples being obtained in response to at least one of the strobe signals, and means for computing the analog-to-digital conversion in response to the multiplicity of digital representations.

2. Apparatus in accordance with claim 1 wherein the means for computing comprises means for determining the one of the digital representations having the largest value.

3. Apparatus in accordance with claim 1 wherein the means for detecting the analog signal comprises at least one level detector.

4. Apparatus in accordance with claim 3 wherein the means for delaying comprises a multiplicity of delay lines.

5. Apparatus in accordance with claim 3 wherein the means for delaying comprises at least one digital delay means.

6. Apparatus in accordance with claim 4 wherein at least one of the means for sampling comprises an A/D converter having a sample frequency which is slower than the highest frequency of the analog signal.

7. Apparatus in accordance with claim 6 wherein the A/D converter comprises a flash A/D converter.

* * * * *